US011641716B2

(12) United States Patent
Noguchi et al.

(10) Patent No.: US 11,641,716 B2
(45) Date of Patent: May 2, 2023

(54) METHOD FOR MANUFACTURING PRINTED CIRCUIT BOARD

(71) Applicant: SUMITOMO ELECTRIC PRINTED CIRCUITS, INC., Koka (JP)

(72) Inventors: Kou Noguchi, Koka (JP); Hiroshi Ueda, Koka (JP)

(73) Assignee: SUMITOMO ELECTRIC PRINTED CIRCUITS, INC., Koka (JP)

( * ) Notice: Subject to any disclaimer, the term of this patent is extended or adjusted under 35 U.S.C. 154(b) by 978 days.

(21) Appl. No.: 16/474,705

(22) PCT Filed: Dec. 4, 2017

(86) PCT No.: PCT/JP2017/043443
§ 371 (c)(1),
(2) Date: Jun. 28, 2019

(87) PCT Pub. No.: WO2018/128037
PCT Pub. Date: Jul. 12, 2018

(65) Prior Publication Data
US 2021/0136921 A1   May 6, 2021

(30) Foreign Application Priority Data
Jan. 5, 2017 (JP) .............................. JP2017-000617

(51) Int. Cl.
*H05K 3/07* (2006.01)
*H05K 3/00* (2006.01)
*G03F 7/09* (2006.01)
*H05K 3/06* (2006.01)
*H05K 3/18* (2006.01)

(52) U.S. Cl.
CPC ............. *H05K 3/0073* (2013.01); *G03F 7/09* (2013.01); *H05K 3/07* (2013.01); *H05K 3/06* (2013.01); *H05K 3/18* (2013.01)

(58) Field of Classification Search
CPC .... H05K 1/0263; H05K 1/0265; H05K 3/107; H05K 3/108
See application file for complete search history.

(56) References Cited

U.S. PATENT DOCUMENTS 5,414,223 A * 5/1995 Suski ...................... H05K 1/116
361/752
2009/0159327 A1* 6/2009 Hirose ................... H05K 1/113
174/250

FOREIGN PATENT DOCUMENTS

EP       1 083 779 A1    3/2001
JP       H03-244181 A   10/1991
JP       2007-288079 A  11/2007
(Continued)

*Primary Examiner* — Jeremy C Norris
(74) *Attorney, Agent, or Firm* — Faegre Drinker Biddle & Reath LLP (57) ABSTRACT

A method for manufacturing a printed circuit board according to one embodiment of the present invention includes a step of forming a resist pattern, and a step of forming a conductive pattern by using the resist pattern. The resist pattern has an acute angle portion in which an outer edge of a resist is bent to form an acute angle in a plan view. In a corner portion of the acute angle portion, an outer-side outer edge of the resist is rounded, and a radius of curvature of the outer-side outer edge is more than or equal to a distance from the outer-side outer edge to another outer edge adjacent thereto in a direction away from a center of curvature of the outer-side outer edge.

6 Claims, 7 Drawing Sheets

(56) References Cited

FOREIGN PATENT DOCUMENTS

| JP | 2010-272837 A | 12/2010 |
|----|---------------|---------|
| WO | WO-99/60831 A1 | 11/1999 |

\* cited by examiner

METHOD FOR MANUFACTURING PRINTED CIRCUIT BOARD

TECHNICAL FIELD

The present invention relates to a method for manufacturing a printed circuit board. The present applications claims priority to Japanese Patent Application No. 2017-000617 filed Jan. 5, 2017, the entire contents of which are incorporated herein by reference.

BACKGROUND ART

In general, a conductive pattern of a printed circuit board is often formed by a subtractive method or a semiadditive method that involves formation of a resist pattern (refer to Japanese Unexamined Patent Application Publication No. 2010-272837).

According to a typical subtractive method, first, a photosensitive resist layer is stacked on a surface of a printed board original plate that has a base material layer and a metal layer, and then the resist layer is exposed with light and developed so as to form a resist pattern having a planar shape corresponding to the conductive pattern intended to be formed. Next, etching is performed by using the resist pattern as a mask so as to remove portions of the metal layer other than the conductive pattern, and as a result, a conductive pattern that has substantially the same planar shape as the resist pattern can be formed. Lastly, the resist pattern is removed by dissolving so as to obtain a printed circuit board in which a conductive pattern is formed on the base material layer.

In contrast, according to a typical semiadditive method, first, a thin seed layer is formed on a surface of a base material layer by electroless plating or the like. Next, a photosensitive resist layer is stacked on a surface of the seed layer, and then the resist layer is exposed with light and developed so as to form a resist pattern having a planar shape corresponding to portions other than the conductive pattern intended to be formed. Next, by using the resist pattern as a mask, plating is performed in which the seed layer serves as an adherend so as to deposit a metal in openings of the resist pattern. After the resist pattern is removed by dissolving, the portion of the seed layer where the resist pattern had been present is removed by etching so as to obtain a printed circuit board in which a conductive pattern is formed on the base material layer.

CITATION LIST

Patent Literature

PTL 1: Japanese Unexamined Patent Application Publication No. 2010-272837

SUMMARY OF INVENTION

A method for manufacturing a printed circuit board according to one aspect of the present invention includes a step of forming a resist pattern, and a step of forming a conductive pattern by performing selective plating or etching by using the resist pattern. The resist pattern has an acute angle portion in which an outer edge of a resist is bent to form an acute angle in a plan view. In a corner portion of the acute angle portion, an outer-side outer edge of the resist is rounded, and a radius of curvature of the outer-side outer edge is more than or equal to a distance from the outer-side outer edge to another outer edge adjacent thereto in a direction away from a center of curvature of the outer-side outer edge.

A method for manufacturing a printed circuit board according to another aspect of the present invention includes a step of forming a resist pattern, and a step of forming a conductive pattern by performing selective plating or etching by using the resist pattern. The resist pattern has three or more linear openings and an annular opening, and the three or more linear openings are connected via the annular opening.

DESCRIPTION OF EMBODIMENTS

Problems to be Solved by Present Disclosure

In the method for manufacturing a printed circuit board in which a resist pattern is formed, when the wire density of the printed circuit board to be manufactured is increased, there will be more small-width portions in a planar shape of the resist pattern. It has been confirmed that, as the density of the printed circuit board increases, the small-width portions in the resist pattern detach during the resist pattern development, during etching of the metal layer in a subtractive method, or during plating in a semiadditive method, and short-circuiting and disconnection occur in the conductive pattern, possibly lowering the yield.

Thus, an object is to provide a method for manufacturing a printed circuit board with which detachment of the resist pattern can be prevented.

Advantageous Effects of Present Disclosure

The method for manufacturing a printed circuit board according to one embodiment of the present invention can prevent detachment of the resist pattern.

DESCRIPTION OF THE EMBODIMENTS OF THE PRESENT INVENTION (1) A method for manufacturing a printed circuit board according to one embodiment of the present invention includes a step of forming a resist pattern, and a step of forming a conductive pattern by performing selective plating or etching by using the resist pattern. The resist pattern has an acute angle portion in which an outer edge of a resist is bent to form an acute angle in a plan view. In a corner portion of the acute angle portion, an outer-side outer edge of the resist is rounded, and a radius of curvature of the outer-side outer edge is more than or equal to a distance from the outer-side outer edge to another outer edge of the resist adjacent thereto in a direction away from a center of curvature of the outer-side outer edge.

Hereinafter, the outer-side outer edge of the resist may be referred to as the "outer-side outer edge", the radius of curvature of the outer-side outer edge in the corner portion may be referred to as the "radius of curvature of the outer-side outer edge", and another outer edge of the resist adjacent thereto in the direction away from the center of curvature of the outer-side outer edge in the corner portion may be referred to as the "other outer edge".

Note that the outer-side outer edge of the resist means the outer edge on the outer side when the acute angle side of the acute angle portion is the inner side. The distance from the outer-side outer edge to the other outer edge is the distance from the outer-side outer edge to the other outer edge "along the direction of the radius of curvature of the outer-side outer edge".

In this method for manufacturing a printed circuit board, since the radius of curvature of the outer-side outer edge is more than or equal to the distance from the outer-side outer edge to the other outer edge, the entrance length, which is the distance various liquids (etching solution, plating solution, etc.) travel until they collide with the end surface of the resist in the planar direction of the resist pattern, is relatively small. In this manner, according to this method for manufacturing a printed circuit board, since the kinetic energy of various liquids colliding with the end surface of the resist is relatively small, detachment of the resist pattern can be prevented.

The outer-side outer edge may be bent to form an acute angle. The other outer edge may be bent to form an acute angle. In the corner portion of the acute angle portion, the outer-side outer edge and the other outer edge may be similar.

It is sufficient if the radius of curvature of the outer-side outer edge is more than or equal to the distance from the outer-side outer edge to the other outer edge in at least part of the rounded portion of the outer-side outer edge; however, the radius of curvature of the outer-side outer edge may be more than or equal to the distance from the outer-side outer edge to the other outer edge throughout the rounded portion of the outer-side outer edge.

(2) The resist pattern may have a linear opening, and a maximum width of the linear opening in the resist pattern may be less than or equal to 1.2 times the average width of the wires in the conductive pattern. When the maximum width of the linear opening is less than or equal to the aforementioned upper limit, detachment of the resist pattern can be prevented while increasing the wire density.

(3) The resist pattern may have three or more linear openings and an annular opening, and the three or more linear openings may be connected via the annular opening. Since the three or more linear openings in the resist pattern are connected via the annular opening, formation of acute angles in the planar shape of the resist pattern can be prevented (the outer edge of the resist can be prevented from bending and forming an acute angle). In this manner, detachment of the resist pattern rarely occurs even when various liquids that flow along the linear openings in the resist pattern collide with the corners of the openings in the resist pattern.

(4) In the corner portion of the acute angle portion, a width of the resist having the outer-side outer edge in a direction of the radius of curvature may be more than or equal to the distance from the outer-side outer edge to the other outer edge. Since this width is more than or equal to the distance from the outer-side outer edge to the other outer edge, the strength of the resist pattern is increased, and detachment of the resist pattern is further suppressed.

It is sufficient if this width is more than or equal to the distance from the outer-side outer edge to the other outer edge in at least part of the rounded portion of the outer-side outer edge; however, this width may be more than or equal to the distance from the outer-side outer edge to the other outer edge throughout the rounded portion of the outer-side outer edge.

(5) A method for manufacturing a printed circuit board according to another embodiment of the present invention includes a step of forming a resist pattern, and a step of forming a conductive pattern by performing selective plating or etching by using the resist pattern. The resist pattern has three or more linear openings and an annular opening, and the three or more linear openings are connected via the annular opening.

According to the method for manufacturing a printed circuit board, since the three or more linear openings in the resist pattern are connected via the annular opening, formation of acute angles in the planar shape of the resist pattern can be prevented (the outer edge of the resist can be prevented from bending and forming an acute angle). In this manner, detachment of the resist pattern rarely occurs even when various liquids that flow along the linear openings in the resist pattern collide with the corners of the openings in the resist pattern. Thus, this method for manufacturing a printed circuit board can prevent detachment of the resist pattern.

(6) The resist pattern may be formed by using a dry film photoresist. Since the thickness of the photoresist can be made uniform and can be decreased by using the dry film photoresist, a finer resist pattern can be easily made. Meanwhile, when a resist pattern is formed by using a dry film photoresist, typically, adhesion may decrease. However, according to this method for manufacturing a printed circuit board, even when the resist pattern is formed by using the dry film photoresist, the kinetic energy of various liquids colliding with the end surface of the resist is decreased, and thus, detachment of the resist pattern can be prevented, the yield can be improved, and the printed circuit board can be manufactured at relatively low cost.

DETAILED DESCRIPTION OF THE EMBODIMENTS OF THE PRESENT INVENTION

The respective embodiments of the method for manufacturing a printed circuit board according to the present invention will now be described in detail by referring to the drawings.

First Embodiment

Figure 1:
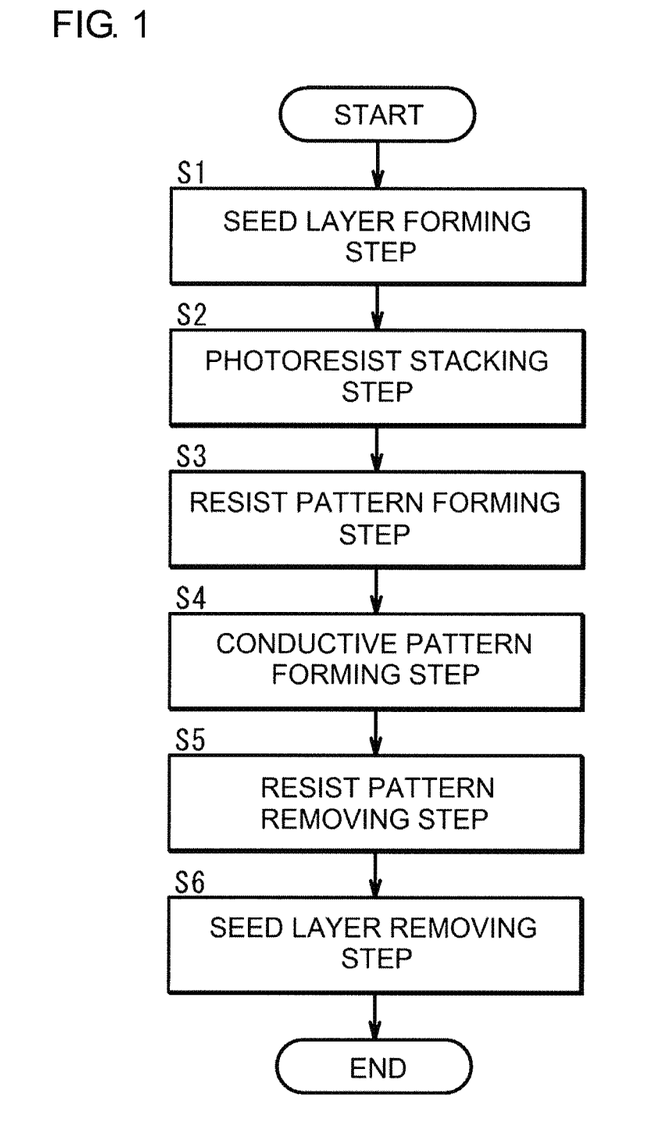
FIG. 1 is a flowchart illustrating the procedure of a method for manufacturing a printed circuit board according to one embodiment of the present invention.

FIG. 1 illustrates the procedure of a method for manufacturing a printed circuit board according to one embodiment of the present invention. Note that the method for manufacturing a printed circuit board of this embodiment is a method categorized as a so-called semiadditive method.

Figure 2A:
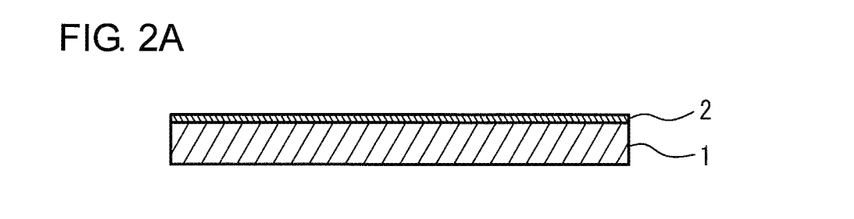
FIG. 2A is a schematic cross-sectional view illustrating one step of the method for manufacturing a printed circuit board illustrated in FIG. 1.
Figure 2B:
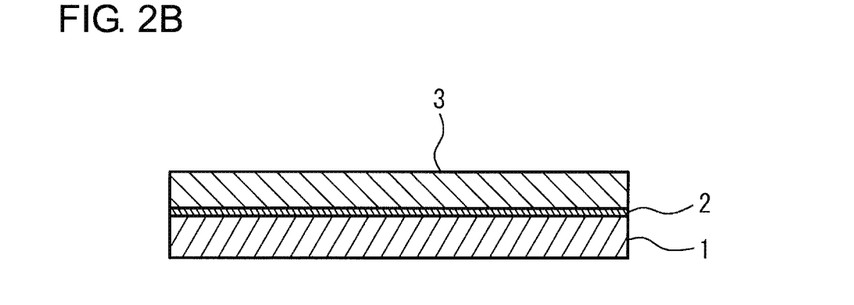
FIG. 2B is a schematic cross-sectional view illustrating a step after the step illustrated in FIG. 2A in the method for manufacturing a printed circuit board illustrated in FIG. 1.
Figure 2C:
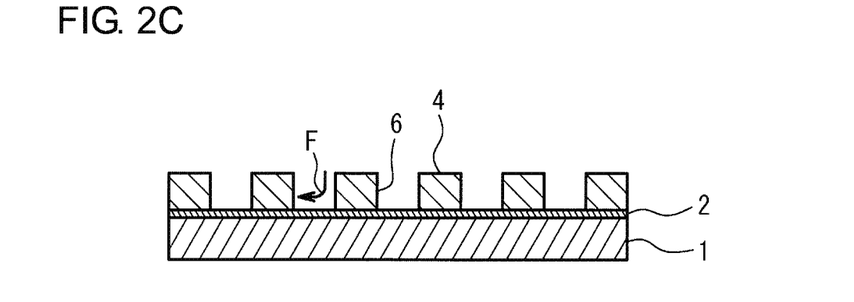
FIG. 2C is a schematic cross-sectional view illustrating a step after the step illustrated in FIG. 2B in the method for manufacturing a printed circuit board illustrated in FIG. 1.
Figure 2D:
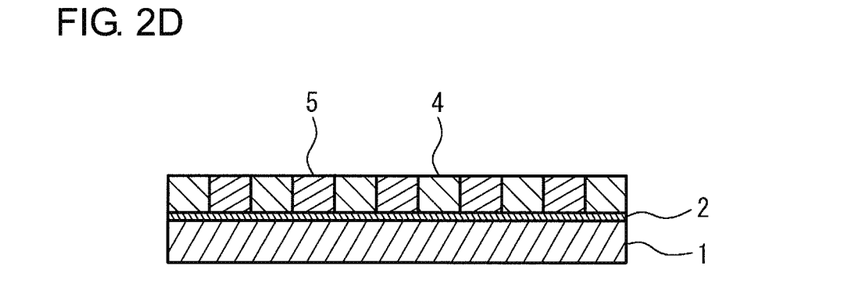
FIG. 2D is a schematic cross-sectional view illustrating a step after the step illustrated in FIG. 2C in the method for manufacturing a printed circuit board illustrated in FIG. 1.
Figure 2E:
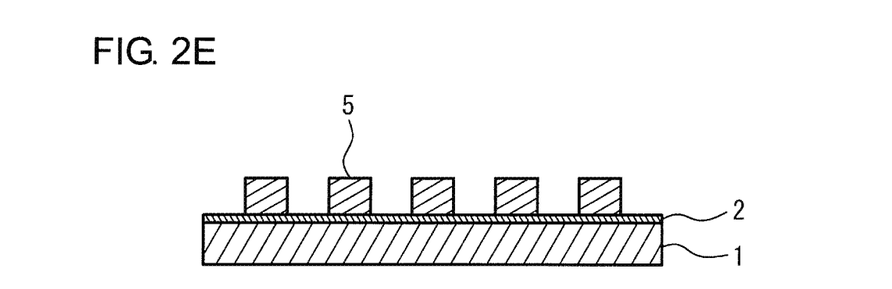
FIG. 2E is a schematic cross-sectional view illustrating a step after the step illustrated in FIG. 2D in the method for manufacturing a printed circuit board illustrated in FIG. 1.
Figure 2F:
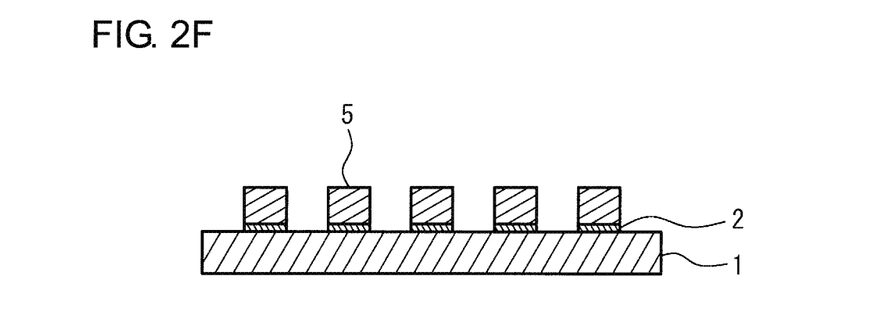
FIG. 2F is a schematic cross-sectional view illustrating a step after the step illustrated in FIG. 2E in the method for manufacturing a printed circuit board illustrated in FIG. 1.

The method for manufacturing a printed circuit board illustrated in FIG. 1 includes a step of forming a conductive seed layer 2 on a surface of a sheet-shaped substrate 1 having an insulating property as illustrated in FIG. 2A <step S1: seed layer forming step>; a step of stacking a photoresist 3 on a surface of the seed layer 2 as illustrated in FIG. 2B <step S2: photoresist stacking step>; a step of forming a resist pattern 4 by exposing and developing the photoresist 3 as illustrated in FIG. 2C <step S3: resist pattern forming step>; a step of forming a conductive pattern 5 that includes wires by performing selective plating using the resist pattern 4 as illustrated in FIG. 2D <step S4: conductive pattern forming step>; a step of removing the resist pattern 4 with a stripping solution as illustrated in FIG. 2E <step S5: resist pattern removing step>; and a step of removing, by etching, the seed layer 2 in portions where the conductive pattern 5 is not formed as illustrated in FIG. 2F <step S6: seed layer removing step>.

<Step S1: Seed Layer Forming Step>

In the seed layer forming step of step S1, for example, the seed layer 2 is formed on a surface of the substrate 1 by electroless plating, coating and baking of a dispersion of metal fine particles, or the like, as illustrated in FIG. 2A.

(Substrate)

Examples of the material for the substrate 1 include flexible resins such as polyimide, liquid crystal polymers, fluororesins, polyethylene terephthalate, and polyethylene naphthalate; rigid materials such as paper phenol, paper epoxy, glass composites, glass epoxy, polytetrafluoroethylene, and a glass substrate; and rigid-flexible material in which a hard material and a soft material are combined.

(Seed Layer)

The seed layer 2 is used as an adherend (cathode) in electroplating in the conductive pattern forming step of step S5 described below.

The lower limit of the average thickness of the seed layer 2 is preferably 50 nm and more preferably 100 nm. The upper limit of the average thickness of the seed layer 2 is preferably 2 µm and more preferably 1.5 µtn. When the average thickness of the seed layer 2 is below the lower limit, continuity of the seed layer 2 cannot be guaranteed, and thus a conductive pattern 5 having a uniform thickness may not be formed. When the average thickness of the seed layer 2 is beyond the upper limit, the manufacturing cost of the printed circuit board may increase beyond what is necessary.

When the seed layer 2 is to be formed by electroless plating, examples of the material for the seed layer 2 include nickel, copper, cobalt, gold, silver, tin, and alloys thereof. Among these, nickel, copper, or cobalt, with which the thickness can be relatively easily increased by autocatalysis, is preferably used.

When the seed layer 2 is to be formed by using a metal fine particle dispersion, a dispersion that contains a dispersion medium for the metal fine particles and a dispersant that uniformly disperses the metal fine particles in the dispersion medium is preferably used as the metal fine particle dispersion. The metal fine particles can be uniformly attached to the surface of the substrate 1 by using the metal fine particle dispersion in which the metal fine particles are uniformly dispersed, and thus a uniform seed layer 2 can be formed on the surface of the substrate 1.

Examples of the main component of the metal fine particles include copper, nickel, gold, and silver. Among these, copper, which is relatively inexpensive and has excellent electrical conductivity, is preferably used. Here, the "main component" means a component having the largest mass content.

The metal fine particles contained in the metal fine particle dispersion can be manufactured by a high-temperature treatment method, a liquid-phase reduction method, a gas phase method, or the like; however, metal fine particles manufactured by a liquid-phase reduction method, which can manufacture particles having uniform particle diameters at relatively low cost, are preferably used.

The dispersant to be contained in the metal fine particle dispersion is not particularly limited; however, a polymer dispersant having a molecular weight of 2,000 or more and 300,000 or less is preferably used. When a polymer dispersant having a molecular weight within the aforementioned range is used, the metal fine particles can be satisfactorily dispersed in the dispersion medium, and the film quality of the obtained seed layer 2 can be made dense and defect-free. When the molecular weight of the dispersant is below the lower limit, the effect of preventing aggregation of the metal fine particles and maintaining the dispersion may not be sufficiently obtained, and, as a result, the seed layer 2 stacked on the substrate 1 may not become dense and defect-free. When the molecular weight of the dispersant is beyond the upper limit, the dispersant is excessively bulky and may inhibit sintering of the metal fine particles during heating performed after application of the metal fine particle dispersion, thereby possibly generating voids. Moreover, when the dispersant is excessively bulky, density of the film quality of the seed layer 2 may be degraded, or the electrical conductivity may be degraded due to the decomposition residue of the dispersant.

From the viewpoint of preventing deterioration of parts, the dispersant is preferably free of sulfur, phosphorus, boron, halogen, or alkali. Examples of the preferable dispersant include those having a molecular weight within the aforementioned range, examples of which include an amine-based polymer dispersant such as polyethyleneimine and polyvinylpyrrolidone, a hydrocarbon-based polymer dispersant having a carboxylic acid group in a molecule, such as polyacrylic acid and carboxymethyl cellulose, and a polymer dispersant having a polar group, such as poval (polyvinyl alcohol), a styrene-maleic acid copolymer, an olefinmaleic acid copolymer, and a copolymer having a polyethyleneimine moiety and a polyethylene oxide moiety in one molecule.

The dispersant can be in a solution state by being dissolved in water or a water-soluble organic solvent when added to the reaction system. The dispersant content ratio is preferably 1 part by mass or more and 60 parts by mass or less per 100 parts by mass of the metal fine particles. The dispersant surrounds the metal fine particles to prevent aggregation of the metal fine particles, and thus the metal fine particles are satisfactorily dispersed. However, when the dispersant content ratio is below the lower limit, the aggregation preventing effect may become insufficient. When the dispersant content ratio is beyond the upper limit, the excess dispersant may inhibit sintering of the metal fine particles during a heating step performed after application of the metal fine particle dispersion and may cause voids to occur, and the decomposition residue of the polymer dispersant remains as an impurity in the seed layer 2 and may degrade the electrical conductivity.

The content ratio of water serving as the dispersion medium in the metal fine particle dispersion is preferably 20 parts by mass or more and 1900 parts by mass or less per 100 parts by mass of the metal fine particles. Water serving as the dispersion medium causes the dispersant to swell sufficiently and satisfactorily disperses the metal fine particles surrounded by the dispersant; however, when the water content ratio is below the lower limit, water may not exhibit a sufficient dispersant swelling effect. When the water content ratio is beyond the upper limit, the proportion of the metal fine particle in the metal fine particle dispersion is decreased, and a satisfactory seed layer 2 having needed thickness and density may not be formed on the surface of the substrate 1.

Various water-soluble organic solvents can be used as the organic solvent to be added to the metal fine particle dispersion as needed. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol, ketones such as acetone and methyl ethyl ketone, polyhydric alcohols and other esters such as ethylene glycol and glycerin, and glycol ethers such as ethylene glycol monoethyl ether and diethylene glycol monobutyl ether.

The content ratio of the water-soluble organic solvent in the metal fine particle dispersion is preferably 30 parts by mass or more and 900 parts by mass or less per 100 parts by mass of the metal fine particles. When the content ratio of the water-soluble organic solvent is below the lower limit, the organic solvent may not sufficiently exhibit a dispersion viscosity-adjusting effect and a vapor pressure adjusting effect. When the content ratio of the water-soluble organic solvent is beyond the upper limit, the effect of swelling the dispersant provided by water may become insufficient, and metal fine particles may aggregate in the metal fine particle dispersion.

Examples of the method for applying the metal fine particle dispersion to the substrate 1 include known coating methods such as a spin coating method, a spray coating method, a bar coating method, a die coating method, a slit coating method, a roll coating method, and a dip coating method.

The solvent dispersant in the metal fine particle dispersion evaporates or thermally decomposes when the coating film of the metal fine particle dispersion applied to the substrate 1 is heated, the remaining metal fine particles become sintered, and thus a seed layer 2 fixed to the surface of the substrate 1 is obtained. Preferably, the coating film of the metal fine particle dispersion is dried before heating.

The metal fine particles are preferably sintered in an atmosphere that contains a particular amount of oxygen. The lower limit of the oxygen concentration of the atmosphere during sintering is preferably 1 volume ppm and more preferably 10 volume ppm. The upper limit of the oxygen concentration is preferably 10,000 volume ppm and more preferably 1,000 volume ppm. When the oxygen concentration is below the lower limit, the manufacturing cost of the printed circuit board may increase beyond what is necessary. When the oxygen concentration is beyond the upper limit, the metal fine particles become excessively oxidized, the electrical conductivity of the seed layer 2 becomes insufficient, and it may become difficult to form a uniform conductive pattern 5 in the conductive pattern forming step.

The lower limit of the sintering temperature is preferably 150° C. and more preferably 200° C. The upper limit of the sintering temperature is preferably 500° C. and more preferably 400° C. When the sintering temperature is below the lower limit, connection between the metal fine particles is insufficient, and the seed layer 2 may collapse. When the sintering temperature is beyond the upper limit, the substrate 1 may deform.

<Step S2: Photoresist Stacking Step>

As illustrated in FIG. 2B, in the photoresist stacking step of step S2, a photoresist 3 having light-sensitivity is stacked on a surface of the seed layer 2.

(Photoresist)

The photoresist 3 is formed of a negative-type resist composition in which polymer bonds are strengthened by exposure with light and thereby decrease the solubility in a developing solution, or a positive-type resist composition in which polymer bonds are weakened by exposure with light and thereby increase the solubility in a developing solution.

The photoresist 3 may be formed on the seed layer 2 by application and drying of a liquid resist composition, but is preferably stacked by thermally bonding a dry film photoresist that has no flowability at room temperature. Since the thickness of the photoresist 3 can be made uniform and can be decreased by using a dry film photoresist as the photoresist 3, a finer resist pattern 4 can be easily made. In addition, as described in detail below, since the method for manufacturing a printed circuit board can prevent detachment of the resist pattern 4, the conductive pattern 5 can be accurately formed even when a dry film photoresist is used as the photoresist 3. Thus, even when a dry film photoresist is used, the manufacturing cost can be suppressed without degradation of the quality of the printed circuit board.

Examples of the dry film photoresist used as the photoresist 3 include commercially available acryl-based dry film photoresists such as "Sunfort (trademark)" by ASAHI KASEI E-materials Corp., "Fotech (trademark)" by Hitachi Chemical Co., Ltd., and "ALPHO™ (trademark)" by Nichigo-Morton Co., Ltd.

The average thickness of the photoresist 3 is selected so that a uniform photoresist 3 can be formed. When a dry film photoresist is used as the photoresist 3, the lower limit of the average thickness of the photoresist 3 is preferably 10 μm and more preferably 15 The upper limit of the average thickness of the photoresist 3 is preferably 100 μm and more preferably 80 μm. When the average thickness of the photoresist 3 is below the lower limit, handling of the dry film resist may become difficult. When the average thickness of the photoresist 3 is beyond the upper limit, the accuracy of the shape of the resist pattern 4 may be degraded.

<Step S3: Resist Pattern Forming Step>

In the resist pattern forming step of step S3, first, a photomask or the like is used to selectively expose the photoresist 3 with light so that portions that dissolve in a developing solution and portions that do not are formed in the photoresist 3.

Subsequently, the portions of the photoresist 3 having high solubility are washed away by using a developing solution so as to obtain a resist pattern 4. In the resist pattern 4, portions corresponding to the conductive pattern 5 to be formed are formed as openings 6.

Examples of the developing solution used in the developing step include an aqueous sodium carbonate solution. The concentration of sodium carbonate can be, for example, 0.5 mass % or more and 2 mass % or less.

(Resist Pattern)

Figure 3:
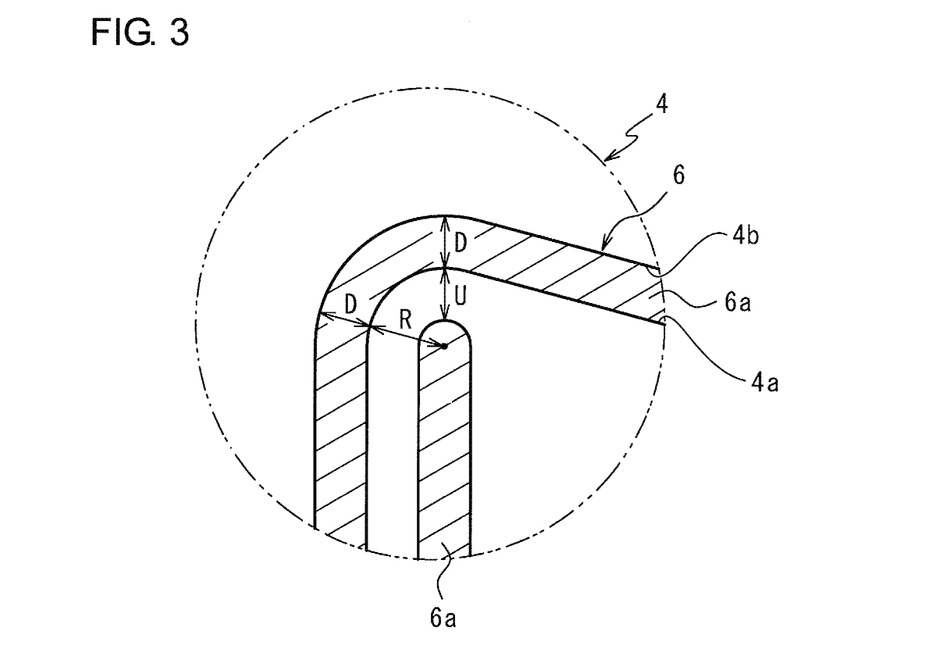
FIG. 3 is a schematic partial enlarged plan view illustrating details of a resist pattern illustrated in FIG. 2C.

As illustrated in FIG. 3, the resist pattern 4 has openings 6 that define the conductive pattern 5. The openings 6 include linear openings 6a that define the wires in the conductive pattern 5. In FIG. 3, the openings 6 of the resist pattern 4 are hatched to facilitate understanding.

The resist pattern 4 has an acute angle portion in which an outer edge of the resist is bent to form an acute angle in a plan view. In a corner portion of the acute angle portion, an outer-side outer edge 4a of the resist is rounded. In the corner portion, the radius R of curvature of the outer-side outer edge 4a is more than or equal to a distance D from the outer-side outer edge 4a to another outer edge 4b adjacent thereto in a direction of the radius R of curvature (a direction substantially perpendicular to the outer-side outer edge 4a) with an opening 6 therebetween (in a direction away from a center of curvature of the corner portion of the outer-side outer edge 4a).

When the conductive pattern 5 is formed by a semiadditive method, examples of the specific method for setting the radius R of curvature of the outer-side outer edge 4a of the resist pattern 4 to be more than or equal to the distance D from the outer-side outer edge 4a to the other outer edge 4b include decreasing the wire width of the conductive pattern 5, and increasing the radius of curvature of the bent portion in the wire in the conductive pattern 5.

If the resist pattern 4 has an acute angle portion where the resist shape is bent and the radius of curvature of the corner portion of that acute angle portion is small, the entrance length, which is the distance the developing solution used in the resist pattern forming step or the plating solution used in the wire pattern forming step travels until it collides with the end surface of the resist of the resist pattern 4, is increased. In other words, when the radius of curvature of the corner portion of the resist pattern 4 is small, the resist near the corner portion is prone to detachment.

Thus, for example, as illustrated by arrow F in FIG. 2C, the radius R of curvature of the outer-side outer edge 4a is set to be more than or equal to the distance D from the outer-side outer edge 4a to the other outer edge 4b so that the distance the liquid (developing solution or the plating solution) flows along the seed layer 2 after entering the opening 6 in the resist pattern 4 is shortened. Thus, the velocity and the kinetic energy of the liquid at the time of colliding with the end surface of the resist of the resist pattern 4 are suppressed, and thus detachment of the resist pattern 4 by collision with the liquid is suppressed.

In addition, in the resist pattern 4, the upper limit of the maximum width of the linear openings 6a defining the wires in the conductive pattern 5 is preferably 1.2 times and more preferably 1.1 times the average width of the wires in the conductive pattern 5. In other words, the design maximum value of the wire width of the conductive pattern 5 may be set to be less than or equal to 1.2 times and preferably 1.1 times the average value. When the maximum width of the linear openings 6a in the resist pattern 4 exceeds the upper limit, the flow velocity of the liquid colliding with the side walls of the linear openings 6a increases, and thus short-circuiting between wires in the conductive pattern 5 may occur due to detachment of the resist pattern 4. Theoretically, the lower limit of the maximum width of the linear openings 6a is equal to the average width of the wires in the conductive pattern 5.

The lower limit of the width U of the resist having the outer-side outer edge 4a in a direction of the radius R of curvature is preferably 1 times and more preferably 1.2 times the distance D from the outer-side outer edge 4a to the other outer edge 4b. When the width U is below the lower limit, the resist pattern 4 becomes more prone to detachment, and thus short-circuiting between wires in the conductive pattern 5 may occur. Although the upper limit of the width U is not particularly limited, the upper limit is regulated by the dimensions of the substrate 1, the number of linear openings 6a formed in parallel in the resist pattern 4, etc.

Figure 4:
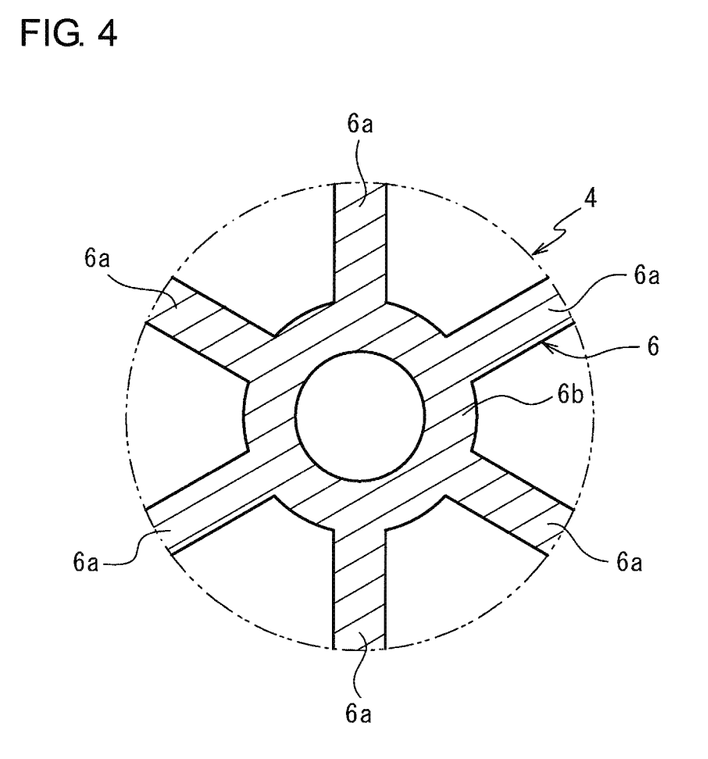
FIG. 4 is a schematic partial enlarged plan view illustrating details of a portion of the resist pattern illustrated in FIG. 2C different from the portion illustrated in FIG. 3.

When three more linear openings 6a are to be connected in the resist pattern 4, as illustrated in FIG. 4, the three or more linear openings 6a may be connected via an annular opening 6b. When the linear openings 6a intersect one another, the fluid flowing in the openings 6 of the resist pattern 4 along the linear openings 6a is likely to collide with corners of the resist pattern 4 formed at the intersections of the linear openings 6a. However, since the three or more linear openings 6a in the resist pattern 4 are connected via the annular opening 6b, the outer edges of the resist pattern 4 are prevented from forming acute angles in the connecting portions of the openings 6, and detachment of the resist pattern 4 can be thereby suppressed.

<Step S4: Conductive Pattern Forming Step>

In the conductive pattern forming step of step S4, a metal is deposited by electroplating on the seed layer 2 exposed in the openings in the resist pattern 4 so as to form a conductive pattern 5, as illustrated in FIG. 2D.

Specifically, in the conductive pattern forming step, a multilayer body constituted by the substrate 1, the seed layer 2, and the resist pattern 4, and an electrode opposing the multilayer body are placed in an electrolyte solution, the negative electrode of a DC power supply is connected to the seed layer 2, and the positive electrode is connected to the opposing electrode so as to cause the metal in the electrolyte solution to precipitate on the surface of the seed layer 2.

As the metal to be deposited by electroplating, in other words, as the metal constituting the conductive pattern 5, copper, nickel, gold, silver, or platinum can be used, for example; among these, copper, which is relatively inexpensive and has excellent electrical conductivity, and nickel, which is relatively inexpensive and has excellent corrosion resistance, are preferable.

(Conductive Pattern)

The average thickness of the conductive pattern 5 to be formed by electroplating is set according to the allowable current of the printed circuit board etc., but, in general, the lower limit of the average thickness of the conductive pattern 5 is preferably 1 μm and more preferably 2 μm. The upper limit of the average thickness of the conductive pattern 5 is preferably 100 μm and more preferably 50 μm. When the average thickness of the conductive pattern 5 is below the lower limit, the conductive pattern 5 may become prone to disconnection. When the average thickness of the conductive pattern 5 is beyond the upper limit, the printed circuit board may become thick beyond what is necessary and the flexibility for the printed circuit board may become insufficient.

<Step S5: Resist Pattern Removing Step>

In the resist pattern removing step of step S5, as illustrated in FIG. 2E, the resist pattern 4 is removed by using a stripping solution.

The stripping solution used in the resist pattern removing step is selected according to the material for the resist pattern 4; for example, an aqueous sodium hydroxide or potassium hydroxide solution having a pH of 11 or more and 13 or less can be used. The concentration of sodium hydroxide or potassium hydroxide is, for example, 1 mass % or more and 5 mass % or less.

<Step S6: Seed Layer Removing Step>

In the seed layer removing step of step S6, as illustrated in FIG. 2F, etching is performed to remove the portions of the seed layer 2 which have been covered with the resist pattern 4 so as to electrically isolate between the wires in the conductive pattern 5. Note that, although the surface of the conductive pattern 5 can be removed as a result of etching, the removal of the surface of the conductive pattern 5 (removal of the metal constituting the conductive pattern 5) does not require consideration (is negligible) if the etching conditions are appropriately selected.

Advantages

In this method for manufacturing a printed circuit board, since the radius R of curvature of the outer-side outer edge 4a in the resist pattern 4 is more than or equal to the distance D from the outer-side outer edge 4a to the other outer edge 4b, the entrance length, which is the distance various liquids travel until they collide with the end surface of the resist in the resist pattern 4, is shortened, and detachment of the resist pattern 4 can be prevented.

Furthermore, in this method for manufacturing a printed circuit board, since the three or more linear openings 6a in the resist pattern 4 are connected via the annular opening 6b, the outer edges of the resist of the resist pattern 4 are prevented from forming acute angles, and detachment of the resist pattern 4 can be thereby prevented.

Thus, a printed circuit board manufactured by this method for manufacturing a printed circuit board has a relatively high yield and excellent reliability since short-circuiting of the conductive pattern 5 is suppressed.

Second Embodiment

Figure 5:
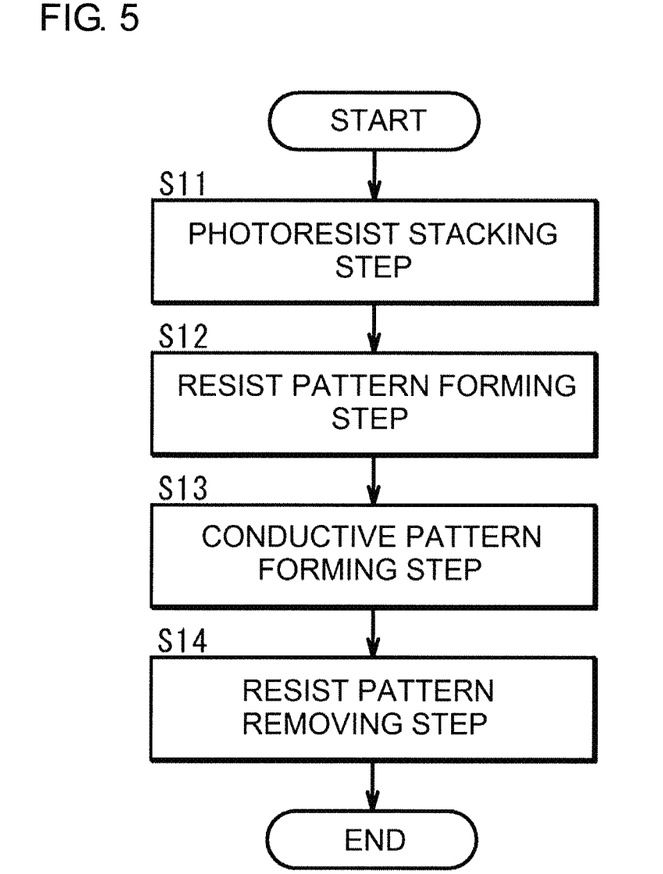
FIG. 5 is a flowchart illustrating the procedure of a method for manufacturing a printed circuit board according to one embodiment different from the one illustrated in FIG. 1.

FIG. 5 illustrates the procedure of a method for manufacturing a printed circuit board according to one embodiment of the present invention. Note that the method for manufacturing a printed circuit board of this embodiment is a method categorized as a so-called subtractive method.

Figure 6A:
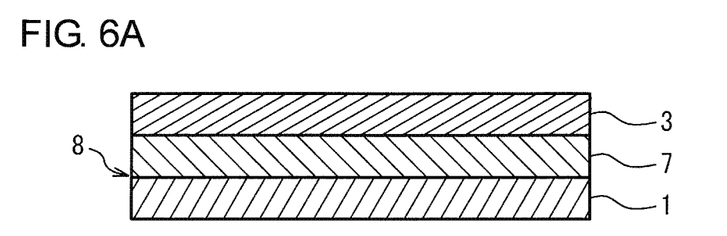
FIG. 6A is a schematic cross-sectional view illustrating one step of the method for manufacturing a printed circuit board illustrated in FIG. 5.
Figure 6B:
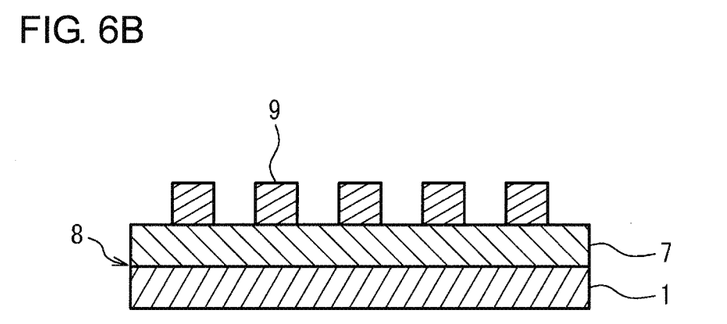
FIG. 6B is a schematic cross-sectional view illustrating a step after the step illustrated in FIG. 6A in the method for manufacturing a printed circuit board illustrated in FIG. 5.
Figure 6C:
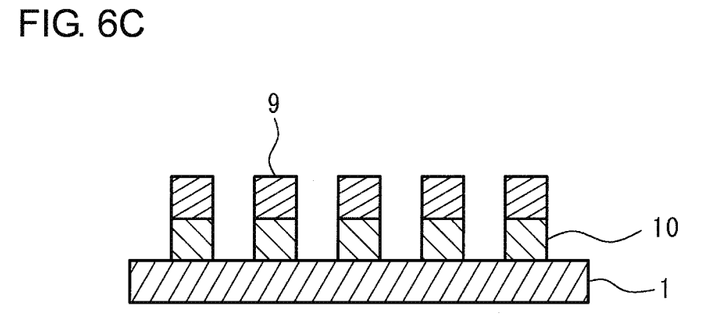
FIG. 6C is a schematic cross-sectional view illustrating a step after the step illustrated in FIG. 6B in the method for manufacturing a printed circuit board illustrated in FIG. 5.
Figure 6D:
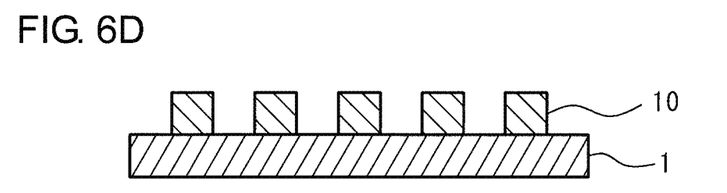
FIG. 6D is a schematic cross-sectional view illustrating a step after the step illustrated in FIG. 6C in the method for manufacturing a printed circuit board illustrated in FIG. 5.

The method for manufacturing a printed circuit board illustrated in FIG. 5 includes a step of stacking a photoresist 3 on a surface of a metal layer 7 in a printed circuit board original plate 8 constituted by a sheet-shaped substrate 1 having an insulating property and the metal layer 7 as illustrated in FIG. 6A <step S11: photoresist stacking step>; a step of forming a resist pattern 9 by exposing and developing the photoresist 3 as illustrated in FIG. 6B <step S12: resist pattern forming step>; a step of forming a conductive pattern 10 that includes wires by performing selective etching on the metal layer 7 by using the resist pattern 9 as illustrated in FIG. 6C <step S13: conductive pattern forming step>; and a step of removing the resist pattern 9 with a stripping solution as illustrated in FIG. 6D <step S14: resist pattern removing step>.

<Step S11: Photoresist Stacking Step>

As illustrated in FIG. 6A, in the photoresist stacking step of step S11, a photoresist 3 having light-sensitivity is stacked on a surface the metal layer 7 of the printed circuit board original plate 8.

The substrate 1 of the printed circuit board original plate 8 illustrated in FIG. 6A can be the same as the substrate 1 illustrated in FIG. 2A. In addition, the structure and stacking method of the photoresist 3 illustrated in FIG. 6A can be the same as the structure and stacking method of the photoresist 3 illustrated in FIG. 2B.

(Metal Layer)

Examples of the material for the metal layer 7 include copper, nickel, gold, silver, platinum, iron, and aluminum, and among these, copper, which is relatively inexpensive and has excellent electrical conductivity, is preferable.

The lower limit of the average thickness of the metal layer 7 is preferably 2 µm and more preferably 5 µm. The upper limit of the average thickness of the metal layer 7 is preferably 500 µm and more preferably 200 µm. When the average thickness of the metal layer 7 is below the lower limit, the conductive properties may become insufficient. When the average thickness of the metal layer 7 is beyond the upper limit, the printed circuit board 1 may become thick beyond what is necessary.

<Step S12: Resist Pattern Forming Step>

In the resist pattern forming step of step S12, first, a photomask or the like is used to selectively expose the photoresist 3 with light so that portions that dissolve in a developing solution and portions that do not are formed in the photoresist 3. Subsequently, the portions of the photoresist 3 having high solubility are washed away by using a developing solution so as to obtain a resist pattern 9 having openings corresponding to the portions other than the conductive pattern 10 to be formed as illustrated in FIG. 6B. In other words, the resist pattern 9 has substantially the same planar shape as that of the conductive pattern 10 intended to be formed.

(Resist Pattern)

Figure 7:
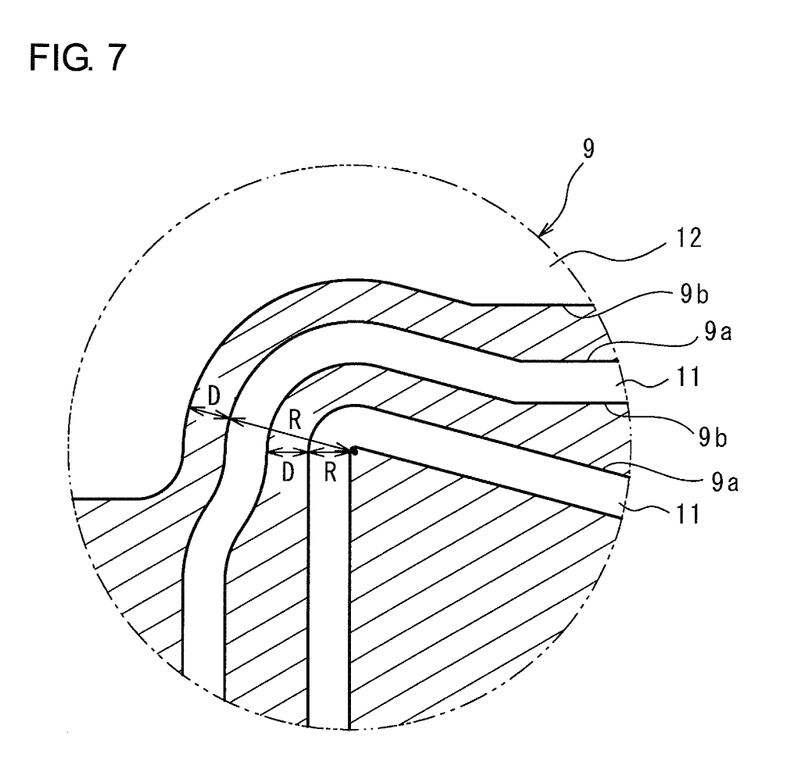
FIG. 7 is a schematic partial enlarged plan view illustrating details of a resist pattern illustrated in FIG. 6B.

As illustrated in FIG. 7, in the resist pattern 9, the radius R of curvature of an outer-side outer edge 9a is more than or equal to a distance D from the outer-side outer edge 9a to another outer edge 9b. In a portion where a wire forming portion 11 corresponding to a wire in the conductive pattern 10 is bent to form an acute angle, another wire forming portion 11 may be disposed near. Moreover, a structure in which a dummy forming portion 12 is disposed on the outer side of the acute angle portion of the outermost wire forming portion 11 may be employed. The dummy forming portion 12 corresponds to a dummy wire portion not connected to a circuit in a final product printed circuit board.

In this manner, since the entrance length, which is the distance the developing solution used in the resist pattern forming step or the etching solution used in the wire pattern forming step travels until it collides with the end surface of the resist of the resist pattern 9, is shortened, the velocity of these liquid colliding with the end surface of the resist of the resist pattern 9 is suppressed. Thus, in this method for manufacturing a printed circuit board using the resist pattern 9, detachment of the resist pattern 9 due to the collision with these liquids is suppressed, and thereby disconnection of the conductive pattern 10 to be formed can be prevented.

In addition, in the resist pattern 9, the upper limit of the maximum width of the linear openings corresponding to the portions other than the wires in the conductive pattern 10, in other words, the linear openings that define the spaces between the wires, is preferably 1.2 times and more preferably 1.1 times the average width of the wires of the conductive pattern 10. In other words, the maximum value of the wire intervals (the distance of the space between the wires) in the conductive pattern 10 may be set to be less than or equal to 1.2 times and preferably 1.1 times the average value of the wire width. When the maximum width of the openings in the resist pattern 9 is beyond the upper limit, the flow velocity of the liquid colliding with the side walls of the openings in the resist pattern 9 increases, thus the resist pattern 9 may become prone to detachment, and disconnection of the wires in the conductive pattern 10 may occur. Note that the lower limit of the wire width of the conductive pattern 10 can be the smallest possible width for development of the photoresist 3.

In the resist pattern 9, the lower limit of the width of the resist having the outer-side outer edge 9a in a direction of the radius R of curvature, in other words, the wire width in the bent portion in the conductive pattern 10, is preferably 1 times and more preferably 1.2 times the distance from the outer-side outer edge 9a to the other outer edge 9b. When this width is below the lower limit, the resist pattern 9 becomes more prone to detachment, and thus disconnection of the wires in the conductive pattern 10 may occur. Although the upper limit of the width is not particularly limited, the upper limit is regulated by the dimensions of the substrate 1, the number of the wire forming portions 11 formed in parallel in the resist pattern 9 and the dummy forming portion 12, etc.

<Step S13: Conductive Pattern Forming Step>

In the conductive pattern forming step of step S13, the portions of the metal layer 7 exposed in the openings in the resist pattern 9 are removed by etching so as to form a conductive pattern 10 as illustrated in FIG. 6C.

An acidic solution commonly used for metal layer removal can be used as the etching solution used in the conductive pattern forming step. Examples of the acidic solution include a copper chloride solution, hydrochloric acid, sulfuric acid, and aqua regia.

<Step S5: Resist Pattern Removing Step>

In the resist pattern removing step of step S5, as illustrated in FIG. 6D, the resist pattern 9 is removed by using a stripping solution.

The stripping solution used in the resist pattern removing step is selected according to the material for the resist pattern 9; for example, an aqueous sodium hydroxide or potassium hydroxide solution having a pH of 11 or more and 13 or less can be used. The concentration of sodium hydroxide or potassium hydroxide is, for example, 1 mass % or more and 5 mass % or less.

Advantages

In this method for manufacturing a printed circuit board, since the radius R of curvature of the outer-side outer edge 9a in the resist pattern 9 is more than or equal to the distance D from the outer-side outer edge 9a to the other outer edge 9b, the entrance length, which is the distance various liquids travel until they collide with the end surface of the resist in the resist pattern 9, can be shortened, and detachment of the resist pattern 9 can be prevented. Thus, a printed circuit board manufactured by the method for manufacturing a printed circuit board has a relatively high yield and excellent reliability since disconnection of the conductive pattern 10 rarely occurs.

Other Embodiments

The embodiments disclosed herein are exemplarily in every aspect and should not be considered as limiting. The scope of the present invention is not limited to the features of the aforementioned embodiments but is indicated by the claims, and all modifications and alterations are intended to be included in the scope of meaning of the claims and equivalents thereof.

The resist pattern formed by the method for manufacturing a printed circuit board may have only one structure selected from a structure in which the radius of curvature of the outer-side outer edge is more than or equal to the distance from the outer-side outer edge to the other outer edge and a structure in which three or more linear openings are connected via an annular opening.

Moreover, in the resist pattern formed by the method for manufacturing a printed circuit board, the shape of the annular opening connecting the three or more linear openings is not limited to annular and may be a polygonal ring.

The annular opening connecting the three or more linear openings may be any opening that does not form an acute angle in the outer edge of the resist at the connecting portion with the linear opening.

Alternatively, another annular opening may be formed inside the annular opening, and a structure in which the inner annular opening and the outer annular opening are connected at two or more positions may be employed. When the three or more linear openings define the wires in the conductive pattern, this structure can reduce the electrical resistance at the connecting portions between the three or more wires connected to one another.

REFERENCE SIGNS LIST 1 substrate
2 seed layer
3 photoresist
4 resist pattern
4a outer-side outer edge
4b other outer edge
5 conductive pattern
6 opening
6a linear opening
6b annular opening
7 metal layer
8 printed circuit board original plate
9 resist pattern
9a outer-side outer edge
9b other outer edge
10 conductive pattern
wire forming portion
12 dummy forming portion
D distance
R radius of curvature
U width
S1 seed layer forming step
S2 photoresist stacking step
S3 resist pattern forming step
S4 conductive pattern forming step
S5 resist pattern removing step
S6 seed layer removing step
S11 photoresist stacking step S12 resist pattern forming step
S13 conductive pattern forming step
S14 resist pattern removing step

The invention claimed is:

1. A method for manufacturing a printed circuit board, comprising a step of forming a resist pattern from a resist, and a step of forming a conductive pattern by performing selective plating or etching by using the resist pattern,
   wherein the resist pattern has an acute angle portion in which an outer edge of the resist is bent to form an acute angle in a plan view,
   in a corner portion of the acute angle portion, an outer-side outer edge of the resist is rounded, and a radius of curvature of the outer-side outer edge is more than or equal to a distance from the outer-side outer edge to another outer edge adjacent thereto in a direction away from a center of curvature of the outer-side outer edge, and
   an average thickness of the resist is 15 μm or more and 100 μm or less.

2. The method for manufacturing a printed circuit board according to claim 1, wherein the resist pattern has a linear opening, and
   a maximum width of the linear opening is less than or equal to 1.2 times an average width of wires in the conductive pattern.

3. The method for manufacturing a printed circuit board according to claim 1, wherein the resist pattern has three or more linear openings and an annular opening, and
   the three or more linear openings are connected via the annular opening.

4. The method for manufacturing a printed circuit board according to claim 1, wherein, in the corner portion of the acute angle portion, a width of the resist having the outer-side outer edge in a direction of the radius of curvature is more than or equal to the distance from the outer-side outer edge to the other outer edge.

5. The method for manufacturing a printed circuit board according to claim 1, wherein the resist is a dry film photoresist.

6. A method for manufacturing a printed circuit board, comprising a step of forming a resist pattern from a resist, and a step of forming a conductive pattern by performing selective plating or etching by using the resist pattern,
   wherein the resist pattern has three or more linear openings and an annular opening,
   the three or more linear openings are connected via the annular opening, and
   an average thickness of the resist is 15 μm or more and 100 μm or less.

* * * * *